United States Patent
Li et al.

(10) Patent No.: US 7,521,354 B2
(45) Date of Patent: Apr. 21, 2009

(54) LOW K INTERLEVEL DIELECTRIC LAYER FABRICATION METHODS

(75) Inventors: Weimin Li, Boise, ID (US); Zhiping Yin, Boise, ID (US); William Budge, Homedale, ID (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 11/266,914

(22) Filed: Nov. 4, 2005

(65) Prior Publication Data

US 2006/0068584 A1    Mar. 30, 2006

Related U.S. Application Data

(60) Continuation of application No. 09/536,037, filed on Mar. 27, 2000, now Pat. No. 7,067,414, which is a division of application No. 09/388,826, filed on Sep. 1, 1999, now abandoned.

(51) Int. Cl.
*H01L 21/31*    (2006.01)

(52) U.S. Cl. .................. 438/623; 438/772; 438/780; 438/789

(58) Field of Classification Search .............. 438/623, 438/770–772, 780, 789
See application file for complete search history.

(56) References Cited

U.S. PATENT DOCUMENTS

| | | | |
|---|---|---|---|
| 4,158,717 A | 6/1979 | Nelson | |
| 4,444,617 A | 4/1984 | Whitcomb | |
| 4,474,975 A | 10/1984 | Clemons et al. | |
| 4,523,214 A | 6/1985 | Hirose et al. | |

(Continued)

FOREIGN PATENT DOCUMENTS

EP    0 471 185 A2    7/1991

(Continued)

OTHER PUBLICATIONS

U.S. Appl. No. 09/234,233, filed Jan. 1999, Li et al.

(Continued)

*Primary Examiner*—M. Wilczewski
*Assistant Examiner*—Toniae M. Thomas
(74) *Attorney, Agent, or Firm*—Wells St. John P.S.

(57) ABSTRACT

A low k interlevel dielectric layer fabrication method includes providing a substrate having integrated circuitry at least partially formed thereon. An oxide comprising interlevel dielectric layer comprising carbon and having a dielectric constant no greater than 3.5 is formed over the substrate. After forming the carbon comprising dielectric layer, it is exposed to a plasma comprising oxygen effective to reduce the dielectric constant to below what it was prior to said exposing. A low k interlevel dielectric layer fabrication method includes providing a substrate having integrated circuitry at least partially formed thereon. In a chamber, an interlevel dielectric layer comprising carbon and having a dielectric constant no greater than 3.5 is plasma enhanced chemical vapor deposited over the substrate at subatmospheric pressure. After forming the carbon comprising dielectric layer, it is exposed to a plasma comprising oxygen at a subatmospheric pressure effective to reduce the dielectric constant by at least 10% below what it was prior to said exposing. The exposing occurs without removing the substrate from the chamber between the depositing and the exposing, and pressure within the chamber is maintained at subatmospheric between the depositing and the exposing.

21 Claims, 1 Drawing Sheet

U.S. PATENT DOCUMENTS

| | | | |
|---|---|---|---|
| 4,552,783 A | 11/1985 | Stoll et al. | |
| 4,562,091 A | 12/1985 | Sachdev et al. | |
| 4,592,129 A | 6/1986 | Legge | |
| 4,600,671 A | 7/1986 | Saitoh et al. | |
| 4,648,904 A | 3/1987 | DePasquale et al. | |
| 4,695,859 A | 9/1987 | Guha et al. | |
| 4,702,936 A | 10/1987 | Maeda et al. | |
| 4,755,478 A | 7/1988 | Abernathey et al. | |
| 4,764,247 A | 8/1988 | Leveriza et al. | |
| 4,805,683 A | 2/1989 | Magdo et al. | |
| 4,833,096 A | 5/1989 | Huang et al. | |
| 4,863,755 A | 9/1989 | Hess et al. | |
| 4,870,470 A | 9/1989 | Bass, Jr. et al. | |
| 4,907,064 A | 3/1990 | Yamazaki et al. | |
| 4,910,160 A | 3/1990 | Jennings | |
| 4,940,509 A | 7/1990 | Tso et al. | |
| 4,954,867 A | 9/1990 | Hosaka | |
| 4,971,655 A | 11/1990 | Stefano et al. | |
| 4,992,306 A | 2/1991 | Hochberg et al. | |
| 5,034,348 A | 7/1991 | Hartswick et al. | |
| 5,036,383 A | 7/1991 | Mori | |
| 5,061,509 A | 10/1991 | Naito et al. | |
| 5,140,390 A | 8/1992 | Li et al. | |
| 5,219,613 A | 6/1993 | Fabry et al. | |
| 5,234,869 A | 8/1993 | Mikata et al. | |
| 5,244,537 A | 9/1993 | Ohnstein | |
| 5,260,600 A | 11/1993 | Harada | |
| 5,270,267 A | 12/1993 | Ouellet | |
| 5,276,347 A | 1/1994 | Wei et al. | |
| 5,285,017 A | 2/1994 | Gardner | |
| 5,286,661 A | 2/1994 | de Fresart et al. | |
| 5,302,366 A | 4/1994 | Schuette et al. | |
| 5,312,768 A | 5/1994 | Gonzalez | |
| 5,314,724 A | 5/1994 | Tsukune et al. | |
| 5,340,621 A | 8/1994 | Matsumoto et al. | |
| 5,356,515 A | 10/1994 | Tahara et al. | |
| 5,376,591 A | 12/1994 | Maeda et al. | |
| 5,405,489 A | 4/1995 | Kim et al. | |
| 5,413,963 A | 5/1995 | Yen et al. | |
| 5,429,987 A | 7/1995 | Allen | |
| 5,439,838 A | 8/1995 | Yang | |
| 5,441,797 A | 8/1995 | Hogan et al. | |
| 5,461,003 A | 10/1995 | Havemann et al. | |
| 5,470,772 A | 11/1995 | Woo | |
| 5,472,827 A | 12/1995 | Ogawa et al. | |
| 5,472,829 A | 12/1995 | Ogawa | |
| 5,482,894 A | 1/1996 | Havemann | |
| 5,498,555 A | 3/1996 | Lin | |
| 5,536,857 A | 7/1996 | Narula et al. | |
| 5,541,445 A | 7/1996 | Quellet | |
| 5,543,654 A | 8/1996 | Dennen | |
| 5,554,567 A | 9/1996 | Wang | |
| 5,591,494 A | 1/1997 | Sato et al. | |
| 5,591,566 A | 1/1997 | Ogawa | |
| 5,593,741 A | 1/1997 | Ikeda | |
| 5,600,165 A | 2/1997 | Tsukamoto et al. | |
| 5,639,687 A | 6/1997 | Roman et al. | |
| 5,641,607 A | 6/1997 | Ogawa et al. | |
| 5,648,202 A | 7/1997 | Ogawa et al. | |
| 5,652,187 A | 7/1997 | Kim et al. | |
| 5,656,330 A | 8/1997 | Niiyama et al. | |
| 5,656,337 A | 8/1997 | Park et al. | |
| 5,661,093 A | 8/1997 | Ravi et al. | |
| 5,667,015 A | 9/1997 | Harestad et al. | |
| 5,670,297 A | 9/1997 | Ogawa et al. | |
| 5,674,356 A | 10/1997 | Nagayama | |
| 5,677,015 A | 10/1997 | Hasegawa | |
| 5,677,111 A | 10/1997 | Ogawa | |
| 5,691,212 A | 11/1997 | Tsai et al. | |
| 5,698,352 A | 12/1997 | Ogawa et al. | |
| 5,709,741 A | 1/1998 | Akamatsu et al. | |
| 5,710,067 A | 1/1998 | Foote et al. | |
| 5,711,987 A | 1/1998 | Bearinger et al. | |
| 5,731,242 A | 3/1998 | Parat et al. | |
| 5,741,721 A | 4/1998 | Stevens | |
| 5,744,399 A | 4/1998 | Rostoker et al. | |
| 5,747,388 A | 5/1998 | Küsters et al. | |
| 5,750,442 A | 5/1998 | Juengling | |
| 5,753,320 A | 5/1998 | Mikoshiba et al. | |
| 5,759,746 A | 6/1998 | Azuma et al. | |
| 5,759,755 A | 6/1998 | Park et al. | |
| 5,783,493 A | 7/1998 | Yeh et al. | |
| 5,786,039 A | 7/1998 | Brouquet | |
| 5,789,819 A | 8/1998 | Gnade et al. | |
| 5,792,689 A | 8/1998 | Yang et al. | |
| 5,796,151 A | 8/1998 | Hsu et al. | |
| 5,800,877 A | 9/1998 | Maeda et al. | |
| 5,801,399 A | 9/1998 | Hattori et al. | |
| 5,807,660 A | 9/1998 | Lin et al. | |
| 5,817,549 A | 10/1998 | Yamazaki et al. | |
| 5,831,321 A | 11/1998 | Nagayama | |
| 5,838,052 A | 11/1998 | McTeer | |
| 5,840,610 A | 11/1998 | Gilmer et al. | |
| 5,858,880 A | 1/1999 | Dobson et al. | |
| 5,872,035 A | 2/1999 | Kim et al. | |
| 5,872,385 A | 2/1999 | Taft et al. | |
| 5,874,367 A | 2/1999 | Dobson | |
| 5,883,011 A | 3/1999 | Lin et al. | |
| 5,883,014 A | 3/1999 | Chen et al. | |
| 5,933,721 A | 8/1999 | Hause | |
| 5,948,482 A | 9/1999 | Brinker et al. | |
| 5,960,289 A | 9/1999 | Tsui et al. | |
| 5,962,581 A | 10/1999 | Hayase et al. | |
| 5,968,324 A | 10/1999 | Cheung et al. | |
| 5,968,611 A | 10/1999 | Kaloyeros et al. | |
| 5,981,368 A | 11/1999 | Gardner et al. | |
| 5,985,519 A | 11/1999 | Kakamu et al. | |
| 5,986,318 A | 11/1999 | Kim et al. | |
| 5,994,217 A | 11/1999 | Ng | |
| 5,994,730 A | 11/1999 | Shrivastava et al. | |
| 6,001,741 A | 12/1999 | Alers | |
| 6,001,747 A | 12/1999 | Annapragada | |
| 6,004,850 A | 12/1999 | Lucas et al. | |
| 6,008,121 A | 12/1999 | Yang et al. | |
| 6,008,124 A | 12/1999 | Sekiguchi et al. | |
| 6,017,614 A | 1/2000 | Tsai et al. | |
| 6,017,779 A | 1/2000 | Miyasaka | |
| 6,020,243 A | 2/2000 | Wallace et al. | |
| 6,022,404 A | 2/2000 | Ettlinger et al. | |
| 6,028,015 A | 2/2000 | Wang et al. | |
| 6,030,901 A | 2/2000 | Hopper et al. | |
| 6,037,228 A | 3/2000 | Hsu | |
| 6,040,619 A | 3/2000 | Wang et al. | |
| 6,054,379 A | 4/2000 | Yau et al. | |
| 6,057,217 A | 5/2000 | Uwasaw | |
| 6,057,587 A | 5/2000 | Ghanderhari et al. | |
| 6,060,765 A | 5/2000 | Maeda | |
| 6,060,766 A | 5/2000 | Mehta et al. | |
| 6,071,799 A | 6/2000 | Park et al. | |
| 6,072,227 A | 6/2000 | Yau et al. | |
| 6,080,529 A | 6/2000 | Ye et al. | |
| 6,083,852 A | 7/2000 | Cheung et al. | |
| 6,087,064 A | 7/2000 | Lin et al. | |
| 6,087,267 A | 7/2000 | Dockrey et al. | |
| 6,096,656 A | 8/2000 | Matzke et al. | |
| 6,114,255 A | 9/2000 | Juengling | |
| 6,114,736 A | 9/2000 | Balasubramanyam et al. | |
| 6,118,163 A | 9/2000 | Gardner et al. | |
| 6,121,133 A | 9/2000 | Iyer et al. | |
| 6,124,641 A | 9/2000 | Matsuura | |
| 6,130,168 A | 10/2000 | Chu et al. | |
| 6,133,096 A | 10/2000 | Su et al. | |
| 6,133,613 A | 10/2000 | Yao et al. | |
| 6,133,618 A | 10/2000 | Steiner | |

| | | |
|---|---|---|
| 6,136,636 A | 10/2000 | Wu |
| 6,140,151 A | 10/2000 | Akram |
| 6,140,677 A | 10/2000 | Gardner et al. |
| 6,143,670 A | 11/2000 | Cheng et al. |
| 6,153,504 A | 11/2000 | Shields et al. |
| 6,156,485 A | 12/2000 | Tang et al. |
| 6,156,674 A | 12/2000 | Li et al. |
| 6,159,804 A | 12/2000 | Gardner et al. |
| 6,159,871 A | 12/2000 | Loboda et al. |
| 6,184,151 B1 | 2/2001 | Adair et al. |
| 6,184,158 B1 | 2/2001 | Shufflebotham et al. |
| 6,187,657 B1 | 2/2001 | Xiang et al. |
| 6,187,694 B1 | 2/2001 | Cheng et al. |
| 6,198,144 B1 | 3/2001 | Pan et al. |
| 6,200,835 B1 | 3/2001 | Manning |
| 6,200,863 B1 | 3/2001 | Xiang et al. |
| 6,204,168 B1 | 3/2001 | Naik et al. |
| 6,208,004 B1 | 3/2001 | Cunningham |
| 6,209,484 B1 | 4/2001 | Huang et al. |
| 6,218,292 B1 | 4/2001 | Foote |
| 6,225,217 B1 | 5/2001 | Usami et al. |
| 6,235,568 B1 | 5/2001 | Murthy et al. |
| 6,235,591 B1 | 5/2001 | Balasubramanian et al. |
| 6,238,976 B1 | 5/2001 | Noble et al. |
| 6,268,282 B1 | 7/2001 | Sandhu et al. |
| 6,274,292 B1 | 8/2001 | Yin et al. |
| 6,281,100 B1 | 8/2001 | Yin et al. |
| 6,284,677 B1 | 9/2001 | Hsiao et al. |
| 6,323,101 B1 | 11/2001 | Li et al. |
| 6,331,493 B1 * | 12/2001 | Sharan ................... 438/765 |
| 6,348,407 B1 | 2/2002 | Gupta et al. |
| 6,373,114 B1 | 4/2002 | Jeng et al. |
| 6,383,951 B1 * | 5/2002 | Li .......................... 438/781 |
| 6,403,464 B1 | 6/2002 | Chang |
| 6,429,115 B1 | 8/2002 | Tsai et al. |
| 6,432,791 B1 | 8/2002 | Hutter et al. |
| 6,435,943 B1 | 8/2002 | Chang et al. |
| 6,436,808 B1 * | 8/2002 | Ngo et al. |
| 6,440,860 B1 | 8/2002 | DeBoer et al. |
| 6,444,593 B1 | 9/2002 | Ngo et al. |
| 6,451,504 B2 | 9/2002 | Rolfson et al. |
| 6,465,372 B1 | 10/2002 | Xia et al. |
| 6,486,057 B1 | 11/2002 | Yeh et al. |
| 6,486,061 B1 | 11/2002 | Xia et al. |
| 6,492,688 B1 | 12/2002 | Ilg |
| 6,498,084 B2 | 12/2002 | Bergemont |
| 6,503,818 B1 | 1/2003 | Jang |
| 6,518,122 B1 | 2/2003 | Chan et al. |
| 6,528,432 B1 * | 3/2003 | Ngo et al. ................ 438/780 |
| 6,589,890 B2 * | 7/2003 | Cohen et al. ............. 438/789 |
| 6,627,532 B1 * | 9/2003 | Gaillard et al. .......... 438/623 |
| 6,627,535 B2 | 9/2003 | MacNeil et al. |
| 6,632,478 B2 * | 10/2003 | Gaillard et al. ........ 427/255.37 |
| 6,632,712 B1 | 10/2003 | Ang et al. |
| 6,638,875 B2 | 10/2003 | Han et al. |
| 6,653,247 B2 * | 11/2003 | MacNeil .................. 438/798 |
| 6,716,725 B1 * | 4/2004 | Ishikawa ................. 438/485 |
| 6,720,247 B2 | 4/2004 | Kirkpatrick et al. |
| 6,723,631 B2 | 4/2004 | Noguchi et al. |
| 6,790,778 B1 | 9/2004 | Cheng et al. |
| 6,794,311 B2 | 9/2004 | Huang et al. |
| 6,811,936 B2 | 11/2004 | Smith et al. |
| 6,828,683 B2 | 12/2004 | Li et al. |
| 6,849,561 B1 * | 2/2005 | Goundar ................. 438/765 |
| 6,949,203 B2 | 9/2005 | Hsieh et al. |
| 2001/0003064 A1 | 6/2001 | Ohto |
| 2001/0019868 A1 | 9/2001 | Gonzalez et al. |
| 2001/0038919 A1 | 11/2001 | Berry, III et al. |
| 2002/0016085 A1 | 2/2002 | Huang et al. |
| 2002/0033486 A1 | 3/2002 | Kim et al. |
| 2002/0055275 A1 * | 5/2002 | MacNeil .................. 438/798 |
| 2002/0081834 A1 | 6/2002 | Daniels et al. |
| 2002/0098684 A1 | 7/2002 | Li et al. |
| 2003/0013311 A1 | 1/2003 | Chang et al. |
| 2003/0077916 A1 | 4/2003 | Xu et al. |
| 2003/0164354 A1 | 9/2003 | Hsieh et al. |
| 2003/0173671 A1 | 9/2003 | Hironaga et al. |
| 2003/0173871 A1 | 9/2003 | Hironaga et al. |
| 2003/0201465 A1 | 10/2003 | Ryuzaki et al. |
| 2003/0207594 A1 | 11/2003 | Catabay et al. |
| 2003/0235979 A1 | 12/2003 | Yuasa |
| 2004/0053459 A1 * | 3/2004 | MacNeil .................. 438/200 |
| 2004/0071878 A1 | 4/2004 | Schuhmacher et al. |
| 2004/0126871 A1 | 7/2004 | Smith et al. |
| 2004/0175933 A1 | 9/2004 | Shishida et al. |
| 2005/0023691 A1 | 2/2005 | Watanabe et al. |
| 2005/0064698 A1 | 3/2005 | Chang et al. |
| 2005/0191828 A1 | 9/2005 | Al-Bayati et al. |
| 2007/0098890 A1 * | 5/2007 | Sasaki et al. ............ 427/248.1 |

FOREIGN PATENT DOCUMENTS

| | | |
|---|---|---|
| EP | 0464515 | 1/1992 |
| EP | 0 588 087 A3 | 8/1993 |
| EP | 0 778 496 A2 | 5/1996 |
| EP | 0771886 | 5/1997 |
| EP | 0 942 330 | 9/1999 |
| EP | 1 172 845 A2 | 1/2002 |
| GB | 593727 | 10/1947 |
| JP | 63157443 | 6/1988 |
| JP | 363157443 A | 6/1988 |
| JP | 5-263255 | 10/1993 |
| JP | 06-196400 | 7/1994 |
| JP | 6232113 | 8/1994 |
| JP | 6-244172 | 9/1994 |
| JP | 7201716 | 8/1995 |
| JP | 08-045926 A | 2/1996 |
| JP | 8046186 | 2/1996 |
| JP | 8046188 | 2/1996 |
| JP | 8051058 | 2/1996 |
| JP | 8078322 | 3/1996 |
| JP | 08-213386 A | 8/1996 |
| JP | 09-050993 | 2/1997 |
| JP | 09055351 | 2/1997 |
| JP | 10-163083 | 6/1998 |
| JP | 63316476 | 12/1998 |
| JP | 06067019 A | 9/1999 |
| JP | 2000068261 A | 3/2000 |
| TW | 368687 A | 9/1999 |
| TW | 420844 A | 2/2001 |
| TW | 429473 A | 4/2001 |
| TW | 47112 A | 1/2002 |

OTHER PUBLICATIONS

Defranoux, et al., "Deep ultra-violet measurements of SION anti-reflective coatings by spectroscopic ellipsometry", Thin Solid Films 313-314 (1998) pp. 742-744.

Gaillard et al., Physical and Optical Properties of an Antireflective Layer Based on SiON, J.Vac. Sci Technol. A 15(5), 1997, pp. 2777-2780.

Merriam-Webster Online Dictionary "Partiality" www.merriam-webster.com. Reprinted Jun. 22, 2007, one page.

Loboda et al., "Using Trimethylsilane to Improve Safety, Throughput and Versatility in PECVD Processes", Electrochemical Proceedings, vol. 97-10, pp. 443-453.

Laxman et al., "Synthesizing Low k CVD materials for Fab Use", Semiconductor International (Nov. 2000), pp. 95-102.

Anonymous, "New Gas Helps Make Faster ICs", Machine Design, (Nov. 4, 1999), p. 118.

Jenkins, F. et al., "Fundamentals of Optics", Properties of Light, pp. 9-10 (no date).

Wolf, S. et al., "Silicon Processing for the VLSI Era", vol. 1, pp. 437-441 (no date).

D.R. McKenzie et al., "New Technology for PACVD", Surface and Coatings Technology, 82 (1996), p. 326-333.

S. McClatchie et al., "Low Dielectric Constant Flowfill Technology For IMD Applications", undated, 7 pages.

K. Beekmann et al., "Sub-micron Gap Fill and In-Situ Planarisation using Flowfill$^{SM}$ Technology", Oct. 1995, pp. 1-7.

A. Kiermasz et al., "Planarisation for Sub-Micron Devices Utilizing a New Chemistry", Electrotech, Feb. 1995, 2 pages.

IBM Technical Disclosure Bulletin, "Low-Temperature Deposition of SiO2, Si3N4 or SiO2-Si3N4", vol. 28, No. 9, p. 4170, Feb. 1986.

Bencher, C. et al., "Dielectric antireflective coatings for DUV lithography", Solid State Technology, Mar. 1997, pp. 109-114.

Noboru Shibata, "Plasma-Chemical Vapor-Deposited Silicon Oxide/ Silicon Oxynitride Double-Layer Antireflective Coating for Solar Cells", Japanese Journal of Applied Physics, vol. 30, No. 5, May 1991, pp. 997-1001.

Ralls, Kenneth M., "Introduction to Materials Science and Engineering", John Wiley & Sons, 1976, pp. 312-313.

Ravi K. Laxman, "Synthesizing Low-k CVD Materials for Fab Use", Semiconductor International, Nov. 2000, 10 pages.

Anonymous, "New gas helps make faster IC's". Machine Design Cleveland, Penton Media, Inc., Nov. 4, 1999, p. 118.

Lobada et al., "Using Trimethylsilane to Improve Safety Throughput and Versatility in PECVD Processes", 4$^{th}$ International Symposium on Silicon Nitride and Silicon Dioxide Thin Insulating Films, The Electrochemical Society, Abstract No. 358, p. 454, May 1997.

Dammel, R. R. et al., "Dependence of Optical Constants of AZ BARLi Bottom Coating on Back Conditions", SPIE, vol. 3049, 1997, pp. 963-973.

20029, US99, Search Report.

20030, US99, Search Report.

Heavens, O. S., "Optical Properties of Thin Solid Films", pp. 48-49.

Withmall, R. et al., "Matrix Reactions of Methylsilanes and Oxygen Atoms", Physical Chemistry 1988, pp. 594-602.

Weidman, T. et al., "New photodefinable glass etch masks for entirely dry photolithography: Plasma deposited orarganosilicon hydride polymers", Appl. Phys., Lett 1-25-93, pp. 372-374.

Weidman, T. et al., "All Dry Lithography: Applications of Plasma Polymerized Methylsilane as a Single Layer Resist and Silicon Dioxide Precursor", Journal of Photopolymer Science and Technology, V. 8, #4, 1995, pp. 679-686.

Joubert et al., "Application of Plasma Polymerized Methylsilane in an all dry resist process for 193 and 248 nm Lithography", Microelectronic Engineering 30, 1996, pp. 275-278.

Joshi, A.M. et al., Plasma Deposited Organosilicon Hydride Network Polymers as Versatile Resists for Entirely Dry Mid-Deep UV Photolithography, SPIE, vol. 1925, pp. 709-720.

Matsuura, M. et al., "Highly Reliable Self-Planarizing Low-k Intermetal Dielectric for Sub-quarter Micron Interconnects", IEEE, 1997, pp. 785-788.

Horie, O. et al., "Kinetics and Mechanism of the Reactions of . . . ", J. Phys. Chem., 1991, 4393-4400.

Julius Grant, Hackh's Chemical Dictionary, Fourth Edition, McGraw-Hill Book Company, 1969, rented by Grant, 1972, p. 27.

Wolf et al., "Silicon Processing for the VLSI Era—vol. 1—Process Technology", Prologue, p. xxiii (2 pages total).

Wolf, Stanley, Ph.D., "Silicon Processing for the VLSI Era", Lattice Press, 1986.

Wolf, Stanley, "Silicon Process", vol. 1, pp. 407-413.

Wolf, Stanley, "Silicon Process", vol. 2, pp. 48-49 and 435.

Wolf, Stanley, "Silicon Processing for the VLSI Era", vol. 3, The Submicron MOSFET, p. 635.

Wolf, Stanley, and Tauber, Richard, Silicon Processing for the VLSI Era: vol. 1; Process Technology; "Silicon: Single Crystal Growth and Wafer Preparation", pp. 1 and 2.

* cited by examiner

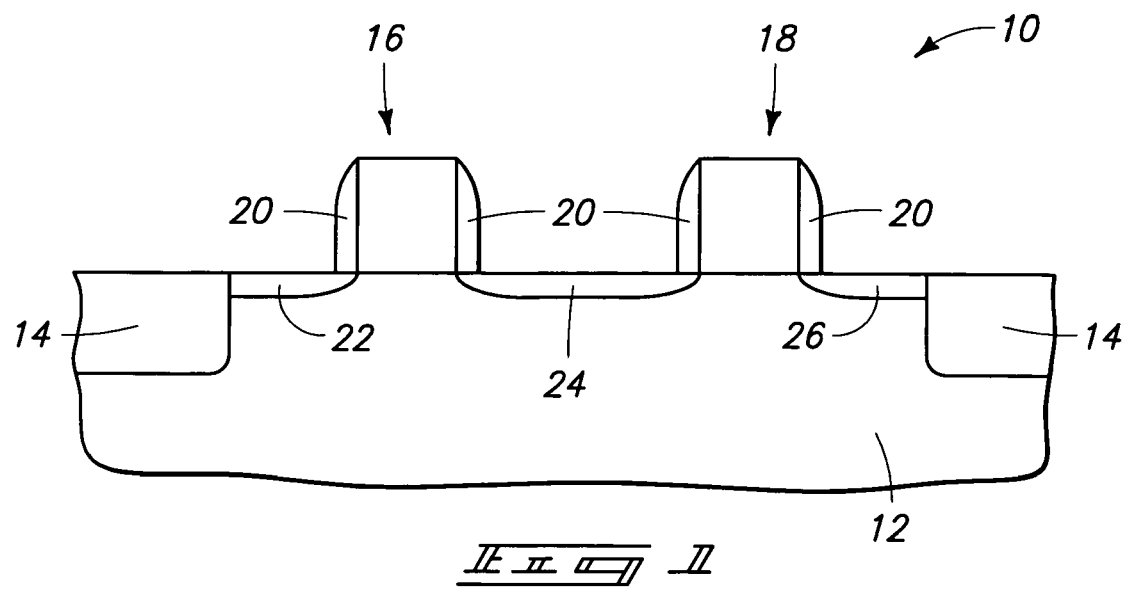
_FIG_ 1
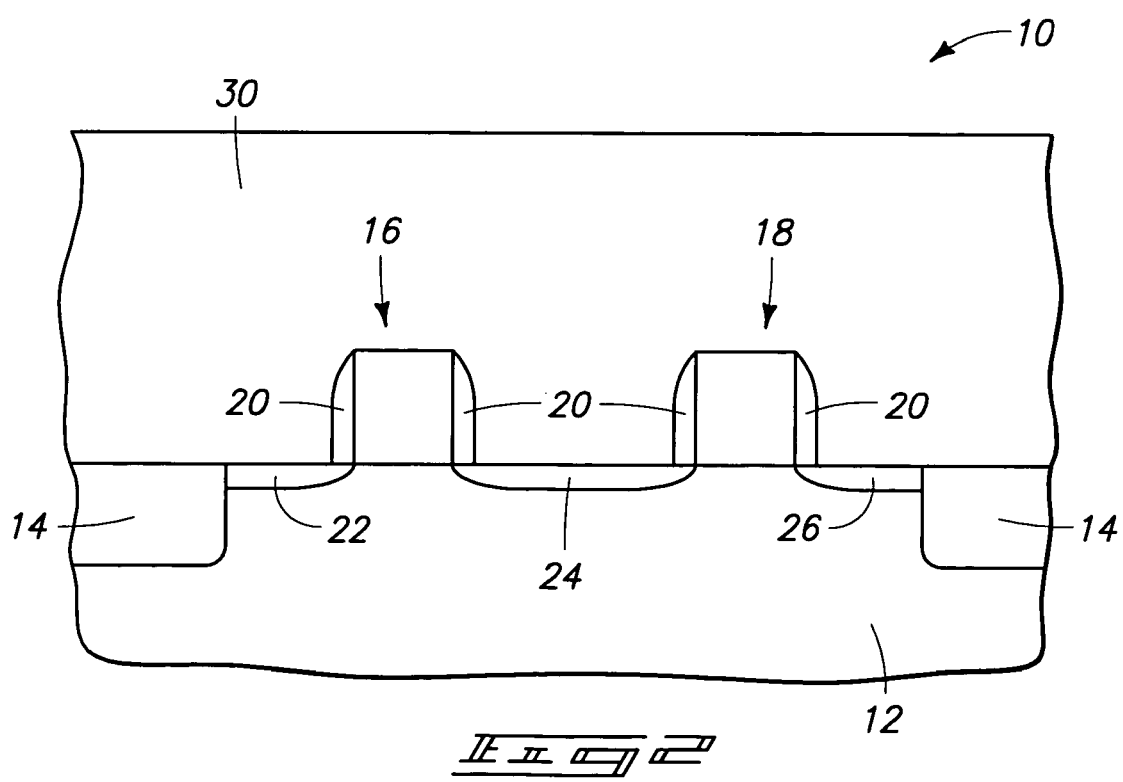
_FIG_ 2

LOW K INTERLEVEL DIELECTRIC LAYER FABRICATION METHODS

RELATED PATENT DATA

This patent resulted from a continuation of U.S. patent application Ser. No. 09/536,037, filed Mar. 27, 2000, now U.S. Pat. No. 7,067,414 which is a divisional of U.S. patent application Ser. No. 09/388,826, filed Sep. 1, 1999, now abandoned, which is hereby incorporated by reference.

TECHNICAL FIELD

This invention relates to methods of forming low k interlevel dielectric layers.

BACKGROUND OF THE INVENTION

In methods of forming integrated circuits, it is frequently desired to electrically isolate components of the integrated circuits from one another with an insulative material. For example, conductive layers can be electrically isolated from one another by separating them with an insulating material. Insulating material received between two different elevation conductive or component layers is typically referred to as an interlevel dielectric material. Also, devices which extend into a semiconductive substrate can be electrically isolated from one another by insulative materials formed within the substrate between the components, such as for example, trench isolation regions.

One typical insulative material for isolating components of integrated circuits is silicon dioxide, which has a dielectric constant of about 4. Yet in many applications, it is desired to utilize insulative materials having dielectric constants lower than that of silicon dioxide to reduce parasitic capacitance from occurring between conductive components separated by the insulative material. Parasitic capacitance reduction continues to have increasing importance in the semiconductor fabrication industry as device dimensions and component spacing continues to shrink. Closer spacing adversely effects parasitic capacitance.

One way of reducing the dielectric constant of certain inherently insulative materials is to provide some degree of carbon content therein. One example technique for doing so has recently been developed by Trikon Technology of Bristol, UK which they refer to as Flowfill™ Technology. Where more carbon incorporation is desired, methylsilane in a gaseous form and $H_2O_2$ in a liquid form are separately introduced into a chamber, such as a parallel plate reaction chamber. A reaction between the methylsilane and $H_2O_2$ can be moderated by introduction of nitrogen into the reaction chamber. A wafer is provided within the chamber and ideally maintained at a suitable low temperature, such as 0° C., at a exemplary pressure of 1 Torr to achieve formation of a methylsilanol structure. Such structure/material condenses on the wafer surface. Although the reaction occurs in the gas phase, the deposited material is in the form of a viscus liquid which flows to fill small gaps on the wafer surface. In applications where deposition thickness increases, surface tension drives the deposited layer flat, thus forming a planarized layer over the substrate.

The liquid methylsilanol is converted to a silicon dioxide structure by a two-step process occurring in two separate chambers from that in which the silanol-type structure was deposited. First, planarization of the liquid film is promoted by increasing the temperature to above 100° C., while maintaining the pressure at about 1 Torr, to result in solidification and formation of a polymer layer. Thereafter, the temperature is raised to approximately 450° C., while maintaining a pressure of about 1 Torr, to form $(CH_3)_xSiO_y$. The $(CH_3)_xSiO_y$ has a dielectric constant of less than or equal to about 3, and is accordingly less likely to be involved in parasitic capacitance than silicon dioxide and/or phosphorous doped silicon dioxide.

Nevertheless, it would be desirable to develop improved methods for reducing parasitic capacitance of interlevel dielectric layers which comprise carbon and regardless of the method of manufacture of such layers.

SUMMARY

The invention comprises methods of forming low k interlevel 17 dielectric layers. In one implementation, a low k interlevel dielectric layer fabrication method includes providing a substrate having integrated circuitry at least partially formed thereon. An oxide comprising interlevel dielectric layer comprising carbon and having a dielectric constant no greater than 3.5 is formed over the substrate. After forming the carbon comprising dielectric layer, it is exposed to a plasma comprising oxygen effective to reduce the dielectric constant to below what it was prior to said exposing.

In one implementation, a low k interlevel dielectric layer fabrication method includes providing a substrate having integrated circuitry at least partially formed thereon. In a chamber, an interlevel dielectric layer comprising carbon and having a dielectric constant no greater than 3.5 is plasma enhanced chemical vapor deposited over the substrate at subatmospheric pressure. After forming the carbon comprising dielectric layer, it is exposed to a plasma comprising oxygen at a subatmospheric pressure effective to reduce the dielectric constant by at least 10% below what it was prior to said exposing. The exposing occurs without removing the substrate from the chamber between the depositing and the exposing, and pressure within the chamber is maintained at subatmospheric between the depositing and the exposing.

In one implementation, a low k interlevel dielectric layer fabrication method includes providing a substrate having integrated circuitry at least partially formed thereon. An interlevel dielectric layer comprising a compound having silicon bonded to both nitrogen and an organic material and having a dielectric constant no greater than 8.0 over is formed over the substrate. After forming the dielectric layer, it is exposed to a plasma comprising nitrogen effective to reduce the dielectric constant to below what it was prior to said exposing.

BRIEF DESCRIPTION OF THE DRAWINGS

Preferred embodiments of the invention are described below with reference to the following accompanying drawings.

FIG. 1 is a diagrammatic view of a semiconductor wafer fragment at one processing step in accordance with the invention.

FIG. 2 is a view of the FIG. 1 wafer at a processing step subsequent to that shown by FIG. 1.

DETAILED DESCRIPTION OF THE PREFERRED EMBODIMENTS

This disclosure of the invention is submitted in furtherance of the 1 constitutional purposes of the U.S. Patent Laws "to promote the progress of science and useful arts" (Article 1, Section 8).

Referring to FIG. 1, an exemplary semiconductor wafer fragment or substrate in process is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 comprises a bulk monocrystalline silicon substrate 12 having trench isolation oxide regions 14 formed therein. Integrated circuitry is at least partially formed thereon in the illustrated example in the form of a pair of transistors 16 and 18. Transistors 16 and 18 can comprise conventional constructions, such as overlying layers of gate oxide, polysilicon and silicide. Insulative spacers 20 are formed adjacent transistor gates 16 and 18. Conductively doped diffusion regions 22, 24 and 26 are formed within substrate 12 and proximate gates 16 and 18.

Referring to FIG. 2 and in accordance with but one aspect of the invention, an interlevel dielectric layer 30 comprising carbon and having a dielectric constant no greater than 3.5 is formed over the FIG. 1 substrate where layer 30 comprises oxide material. Such layer might be formed by a number of methods. One example preferred method includes the Flowfill™ technique referred to above, whereby the formed interlevel dielectric level comprises or ultimately consists essentially of $(CH_3)_xSiO_y$, where x ranges from 1 to 3, and y ranges from 0-2. Such provides but one example where the dielectric layer formed comprises silicon bonded to organic material. Other dielectric layers, as well as the same or other layers, fabricated by different methods are also contemplated.

By way of example only, example preferred alternate methods of producing an interlevel dielectric layer at this point in the process are now described. Such encompass methods of forming insulative materials comprising carbon, silicon and oxygen. In one example, a first gaseous precursor compound comprising carbon and silicon is combined with a second gaseous precursor compound comprising oxygen to form a second compound comprising carbon, silicon and oxygen. The first compound can comprise, for example, $(CH_3)_ySiH_x$, wherein y is an integer of from 1 to 4 and x is an integer from 0 to 3. The second precursor compound is an oxygen-containing moiety that is preferably a "dry" compound (i.e., a compound that does not either contain water or decompose to form water), and can comprise, for example, $N_2O$, or an activated oxygen species (e.g., high energy $O_2$, monatomic oxygen, or oxygen radicals). Such provides but one example process whereby water formation is avoided. In one example, the oxygen-containing moiety is generated by exposing $O_2$ to ultra-violet light (a process which can generate, for example, activated oxygen species in the form of $O_3$). In another aspect, the oxygen-containing moiety is generated by exposing an oxygen-containing gas (e.g., $O_3$, $O_2$, $N_2O$, CO, or $CO_2$) to a plasma. The plasma can be within the reaction chamber or remote from the chamber (i.e., not in the chamber). In another example, a compound comprising silicon, carbon and oxygen is formed by reaction of $SiH_4$ with an organic compound comprising oxygen (e.g., CO or $CO_2$).

In a more specific example, methylsilane or trimethylsilane is combined with $N_2O$ in a reaction chamber. A pressure within the chamber is maintained at from about 300 mTorr to about 30 Torr, and is preferably maintained at from about 1 Torr to about 10 Torr. An exemplary reaction chamber comprises a spacing from about 400 mils to about 600 mils with methylsilane being flowed into the chamber at a rate from about 25 standard cubic centimeters per minute (sccm) to about 2000 sccm (preferably at from about 50 sccm to about 250 sccm). The $N_2O$ is flowed into the reaction chamber at a rate from about 50 sccm to about 3000 sccm (preferably at a rate from about 100 sccm to about 1500 sccm, and more preferably at a rate of from about 500 sccm to about 1200 sccm), and, additionally, helium is flowed into the reaction chamber at a rate of about 500 sccm to about 5000 sccm (preferably from 1000 sccm to about 3000 sccm). A radio frequency (RF) power within the chamber is maintained at from about 50 watts to about 500 watts, and preferably from about 100 watts to about 200 watts. The semiconductor substrate (such as a monocrystalline silicon wafer) is provided within the chamber and maintained at a temperature from about 25° C. to about 450° C.

The above-described processing forms $(CH_3)_xSiO_y$ over a substrate. The concentration of methyl groups within the $(CH_3)_xSiO_y$ is typically from about 10% to about 50% (mole percent), i.e., where x equals or ranges from about 1 to about 3, and y ranges from 0 to about 2. Alternately by way of example only, x can be from about 0.1 to about 1, i.e., the concentration of methyl groups can be from about 5% to about 50% molar. In a particular example, a plasma can be generated within the chamber at a RF power of from about 50 watts to about 500 watts (preferably from about 80 watts to about 200 watts).

Such describes but one example process of forming an interlevel dielectric layer, here by chemical vapor deposition with or without plasma in a chemical vapor deposition chamber. In but another considered example, a gaseous precursor compound is introduced into a chemical vapor deposition reaction chamber and subjected to a plasma treatment. A semiconductor substrate is provided in the chamber, and material comprising carbon and silicon is deposited from the plasma-treated precursor compound to over the substrate. After the material is deposited, it is exposed to an oxygen containing moiety and converted to a second material comprising silicon, carbon and oxygen.

In a more specific example, methylsilane is flowed into a reaction chamber at a pressure of from 300 mTorr to about 30 Torr (preferably from about 1 Torr to about 10 Torr) and subjected to a plasma formed at a power of from about 50 watts to about 500 watts (preferably from 100 watts to about 200 watts). A semiconductor substrate is provided in the reaction chamber and maintained at a temperature of about 0° C. to about 600° C. The plasma treated methylsilane deposits a material comprising methyl groups and silicon over the substrate. The deposited material is then exposed to an oxygen-containing moiety to convert the material to $(CH_3)_xSiO_y$. Accordingly in this example from the oxygen exposure, a whole of the deposited dielectric layer is transformed from one base chemistry (i.e., that comprising a nondescript combination of methyl groups and silicon) to another base chemistry (i.e., $(CH_3)_xSiO_y$) by the oxygen exposure. The oxygen-containing moiety is preferably in gaseous form, and can comprise, for example ozone, $O_2$ and/or $N_2O$. In particular embodiments, the oxygen-containing moiety is subjected to plasma, heat or ultra-violet light. The oxygen treatment preferably occurs at a pressure of from about 300 mTorr to about 1 atmosphere, with the deposited material being maintained at a temperature of from about 0° C. to about 600° C. during the oxygen treatment to convert the base chemistry to $(CH_3)_xSiO_y$.

The above-described processings are again only example preferred techniques of forming the preferred interlevel dielectric layer material comprising carbon, here in the form of $CH_3$, and here producing a preferred layer of $(CH_3)_xSiO_y$. Alternate interlevel dielectric materials comprising carbon are of course contemplated. Further and by way of example only, the deposited interlevel dielectric layer at this point in the process might comprise silicon atoms bonded to both organic material and nitrogen, for example as described below.

After forming carbon comprising dielectric layer 30, in but one aspect of the invention, such layer is exposed to a plasma comprising oxygen effective to reduce the dielectric constant to below what it was prior to said exposing. Preferably, the exposing is at subatmospheric pressure to reduce the dielectric constant by at least 10%, and even more preferably by at least 15%, below what it was prior to said exposing. In a most preferred embodiment, the method by which the interlevel dielectric layer is initially formed is by plasma enhanced chemical vapor deposition in a chamber, with the subsequent exposing of the plasma occurring in subatmospheric pressure in the same chamber. Further, the substrate is preferably not removed from the chamber between the depositing and the exposing. Further, the pressure within the chamber is preferably maintained at subatmospheric between the depositing and the exposing. Further, the exposing is ideally effective to increase stability of the dielectric constant to variation from what the stability was prior to the exposing. Specifically, stability of the dielectric constant of interlevel dielectric materials can have a tendency to increase over time or when exposed to subsequent thermal processing of at least 400° C. Ideally, the exposing is also 11 effective to increase the stability of the dielectric constant of such film.

Exemplary processing in accordance with the invention has been achieved whereby a predominately $(CH_3)_xSiO_y$ interlevel dielectric layer after the exposing had a dielectric constant reduced from 3.0 to about 2.5 or 2.0.

The preferred wafer surface temperature during the exposing is always less than or equal to 550° C., with the exposing also preferably being conducted at subatmospheric pressure. The oxygen comprising plasma is preferably derived at least in part from at least one of $O_2$, $O_3$, $N_2O$, and $NO_x$. Preferred parameters for the exposing in a dual plate capacitively coupled reactor include an RF power range of from 300 to 1000 watts, a pressure range of from 1 Torr to 6 Torr, a temperature range of from 100° C. to 450° C., a spacing between the plates of from 400 to 600 mils, an oxygen gas exposure flow of from 500 to 1500 sccm, an inert gas flow (i.e., He and/or Ar) of from 200 sccm to 800 sccm, and a treatment time of from 20 to 100 to more seconds. It is a preferred intent of the exposing to further not transform a whole of all of the dielectric layer from one base chemistry to another base chemistry by the exposing. An outermost portion of the exposed layer might experience a slight reduction in carbon content, but otherwise that portion and the whole of the layer is not transformed from one fundamental material to another even in spite of the low k reducing or resulting property. In one preferred aspect of the invention, the exposing comprises at least 20 seconds of processing time. More preferably and in preferred sequence, the processing comprises at least 40 seconds, 60 seconds, 80 seconds, and 100 seconds of oxygen containing plasma exposure. The plasma exposing is preferably ineffective to appreciably etch the interlevel dielectric layer.

Where the invention is conducted in situ in a plasma enhanced chemical vapor deposition chamber subsequent to the deposition, the exposing might comprise substantially ceasing feeding of one of the reactive gases while maintaining a feed of one of the precursors which comprises oxygen, and thereby maintaining plasma conditions from the deposition through an extended exposure time with the oxygen containing precursor to achieve the exposing effect.

In another considered aspect of the invention, a nitride comprising interlevel dielectric layer 30 is formed over the substrate to also comprise carbon and having a dielectric constant no greater than 8.0. More preferred, interlevel dielectric layer 30 comprises a compound having silicon bonded to both nitrogen and an organic material and having a dielectric constant no greater than 8.0. After forming such dielectric layer, it is exposed to a plasma comprising nitrogen effective to reduce the dielectric constant to below what it was prior to said exposing, and preferably at least 15% below what it was prior to the exposing. By way of example only, a preferred deposited interlevel dielectric layer material comprises or consists essentially of $(CH_3)_xSi_3N_{(4-x)}$, wherein x is greater than 0 and no greater than 4. Such a composition can be formed by, for example, reacting inorganic silane with one or more of ammonia ($NH_3$), hydrazine ($N_2H_4$), or a combination of nitrogen ($N_2$) and hydrogen ($H_2$). The reaction can occur with or without plasma. However, if the reaction comprises an organic silane in combination with dinitrogen and dihydrogen, the reaction preferably occurs in the presence of plasma.

An exemplary specific reaction is to combine methylsilane ($CH_3SiH_3$) with $NH_3$ in the presence of a plasma to form $(CH_3)_xSi_3N_{(4-x)}$. The exemplary reaction can occur, for example, under the following conditions. A substrate if placed within a reaction chamber of a reactor, and a surface of the substrate is maintained at a temperature of from about 0° C. to about 600° C. Ammonia and methyl silane are flowed into the reaction chamber, and a pressure within the chamber is maintained at from about 300 mTorr to about 30 Torr, with a plasma at a radio frequency (RF) power of from about 50 watts to about 500 watts. A product comprising $(CH_3)_xSi_3N_{(4-x)}$ is then formed and deposited on the substrate.

Using this particular described example, it was found that the product deposited from the described reaction consists essentially of $S(CH_3)_xSi_3N_{(4-x)}$, (wherein x is generally about 1). The $(CH_3)_xSi_3N_{(4-x)}$ is present in the product to a concentration of from greater than 0% to about 50% (mole percent) and is preferably from about 10% to about 20%. The amount of $(CH_3)_xSi_3N_{(4-x)}$ present in the product can be adjusted by providing a feed gas of $SiH_4$ in the reactor in addition to the $CH_3SiH_3$, and by varying a ratio of the $SiH_4$ to the $CH_3SiH_3$, and/or by adjusting RF power.

The above provides but only one example of forming an interlevel dielectric layer comprising a compound having silicon bonded to both nitrogen and an organic material. Other methods of forming the same or different materials are of course contemplated.

After forming the dielectric layer, the nitrogen comprising plasma to which the layer is exposed preferably comprises one or more of $N_2$, $NH_3$, $N_2H_4$, $N_2O$, and $NO_x$. More preferably, the plasma exposing is preferably void of oxygen atoms therein. Wherein the dielectric layer is formed by chemical vapor deposition in a chamber, such as described above, the exposing preferably occurs within the chamber without removing the substrate from the chamber between the forming and the exposing. Again, the plasma exposing like in the first described example is preferably conducted to be ineffective to appreciably etch the interlevel dielectric layer. Further, a whole of the dielectric layer subjected to the exposing is preferably not transformed from one base chemistry to another by the exposing. Preferred temperature, pressure, power, space arrangements, flows, and treatment times are as described above with respect to the first described embodiments.

In compliance with the statute, the invention has been described in language more or less specific as to structural and methodical features. It is to be understood, however, that the invention is not limited to the specific features shown and described, since the means 11 herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A low k interlevel dielectric layer fabrication method comprising:
   providing a substrate having integrated circuitry at least partially formed thereon;
   plasma enhanced chemical vapor depositing within a chamber an interlevel dielectric layer consisting essentially of $(CH_3)_xSiO_y$ and having a dielectric constant no greater than 3.5 over said substrate; and
   after forming the dielectric layer, blanket exposing said dielectric layer in the chamber to a plasma comprising oxygen without depositing more of said dielectric layer effective to reduce the dielectric constant of said dielectric layer to at least 10% below what it was prior to said exposing, wherein a whole of the dielectric layer subjected to the exposing is not transformed from one base chemistry to another by the exposing.

2. A low k interlevel dielectric layer fabrication method comprising:
   providing a substrate having integrated circuitry at least partially formed thereon;
   chemical vapor depositing within a chamber an interlevel dielectric layer consisting essentially of $(CH_3)_xSiO_y$ and having a dielectric constant no greater than 3.5 over said substrate; and
   after forming the dielectric layer, blanket exposing said dielectric layer in the chamber to a plasma comprising oxygen without depositing more of said dielectric aver effective to reduce the dielectric constant of said dielectric aver to at least 10% below what it was prior to said exposing, wherein a whole of the dielectric layer subjected to the exposing is not transformed from one base chemistry to another by the exposing and the exposing is effective to increase stability of the dielectric constant to variation from what it was prior to the exposing.

3. The method of claim 1 wherein the oxygen comprising plasma is derived from one or more compounds selected from the group consisting of $O_2$, $O_3$, $N_2O$, and $NO_x$.

4. A low k interlevel dielectric layer fabrication method comprising:
   providing a substrate having integrated circuitry at least partially formed thereon;
   chemical vapor depositing within a chamber an interlevel dielectric layer consisting essentially of $(CH_3)_xSiO_y$ and having a dielectric constant no greater than 3.5 over said substrate; and
   after forming the dielectric layer, blanket exposing said dielectric layer in the chamber to a plasma comprising oxygen without depositing more of said dielectric aver effective to reduce the dielectric constant of said dielectric layer to at least 10% below what it was prior to said exposing, the exposing occurring within the chamber without removing the substrate from the chamber between the forming and the exposing, wherein a whole of the dielectric layer subjected to the exposing is not transformed from one base chemistry to another by the exposing.

5. The method of claim 1 wherein the temperature during the exposing is always less than or equal to 550° C.

6. The method of claim 1 wherein the plasma exposing is ineffective to appreciably etch the interlevel dielectric layer.

7. The method of claim 1 wherein the dielectric layer subjected to the exposing comprises $(CH_3)_xSiO_y$ which remains as $(CH_3)_xSiO_y$ after the exposing, and wherein the exposing comprises at least 20 seconds.

8. The method of claim 7 wherein the exposing comprises at least 100 seconds.

9. The method of claim 1 wherein the methyl groups of $(CH_3)_xSiO_y$ comprise from 10% to about 50% of the dielectric layer (mole percent) before and after the exposing.

10. The method of claim 1 wherein at least two precursors are fed to the chamber during the depositing, one of the precursors comprising oxygen, the exposing comprising substantially ceasing feeding another of the precursors while feeding the one, and maintaining plasma conditions within the chamber from the depositing through the exposing.

11. A low k interlevel dielectric layer fabrication method comprising:
    providing a substrate having integrated circuitry at least partially formed thereon;
    chemical vapor depositing within a chamber an interlevel dielectric layer consisting essentially of $(CH_3)_xSiO_y$ and having a dielectric constant no greater than 3.5 over said substrate; and
    after forming the dielectric layer, blanket exposing said dielectric layer in the chamber to a plasma comprising oxygen without depositing more of said dielectric aver effective to reduce the dielectric constant of said dielectric layer to at least 10% below what it was prior to said exposing, the exposing occurring between plates of a dual plate capacitively coupled reactor for a time of from 20 to 100 seconds at a plate spacing of from 400 to 600 mils, a RF power range of from 300 to 1000 Watts, a pressure range of from 1 to 6 Torr, a temperature range of from 100 to 450° C., an oxygen comprising gas flow rate of from 500 to 1500 sccm, and an inert gas flow rate of from 200 to 800 sccm, wherein a whole of the dielectric layer subjected to the exposing is not transformed from one base chemistry to another by the exposing.

12. A low k interlevel dielectric layer fabrication method comprising:
    providing a substrate having integrated circuitry at least partially formed thereon;
    in a chamber, plasma enhanced chemical vapor depositing an interlevel dielectric layer comprising $(CH_3)_xSiO_y$ and having a dielectric constant no greater than 3.5 over said substrate at subatmospheric pressure; and
    after forming the dielectric layer, blanket exposing said dielectric layer in the chamber to a plasma comprising oxygen at a subatmospheric pressure without depositing more of said dielectric layer effective to reduce the dielectric constant of said dielectric layer by at least 10% below what it was prior to said exposing, the exposing occurring without removing the substrate from the chamber between the depositing and the exposing, and pressure within the chamber being maintained at subatmospheric between the depositing and the exposing, wherein a whole of the dielectric layer subjected to the exposing is not transformed from one base chemistry to another by the exposing.

13. The method of claim 12 wherein at least two precursors are fed to the chamber during the depositing, one of the precursors comprising oxygen, the exposing comprising substantially ceasing feeding another of the precursors while feeding the one, and maintaining plasma conditions within the chamber from the depositing through the exposing.

14. The method of claim 12 wherein the oxygen comprising plasma is derived from one or more compounds selected from the group consisting of $O_2$, $O_3$, $N_2O$, and $NO_x$.

15. The method of claim 12 wherein the dielectric layer subjected to the exposing comprises $(CH_3)_xSiO_y$ which remains as $(CH_3)_xSiO_y$ after the exposing, and wherein the exposing comprises at least 20 seconds.

16. The method of claim 15 wherein exposing comprises at least 100 seconds.

17. The method of claim 12 wherein the methyl groups of $(CH_3)_xSiO_y$ comprise from 10% to about 50% of the dielectric layer (mole percent) before and after the exposing.

18. The method of claim 12 where blanket exposing occurs at a RF power range of from 300 to 1000 Watts, a pressure range of from 1 to 6 Torr, and a temperature range of from 100 to 450° C.

19. The method of claim 12 wherein the blanket exposing occurs between plates of a dual plate capacitively coupled reactor at a plate spacing of from 400 to 600 mils.

20. The method of claim 12 where blanket exposing occurs between plates of a dual plate capacitively coupled reactor for a time of from 20 to 100 seconds at a plate spacing of from 400 to 600 mils, a RF power range of from 300 to 1000 Watts, a pressure range of from 1 to 6 Torr, a temperature range of from 100 to 450° C., an oxygen comprising gas flow rate of from 500 to 1500 sccm, and an inert gas flow rate of from 200 to 800 sccm.

21. A low k interlevel dielectric layer fabrication method comprising:
providing a substrate having integrated circuitry at least partially formed thereon;
in a chamber, plasma enhanced chemical vapor depositing an interlevel dielectric layer consisting essentially of $(CH_3)_xSiO_y$ and having a dielectric constant no greater than 3.5 over said substrate at subatmospheric pressure; and
after forming the dielectric layer, blanket exposing said dielectric layer in the chamber to a plasma derived from one or more oxygen-comprising gas selected from the group consisting of $O_2$, $O_3$, $N_2O$, and $NO_x$, without depositing more of said dielectric layer, and reducing the dielectric constant of said dielectric layer by at least 15% below what it was prior to said exposing, the exposing occurring without removing the substrate from the chamber between the depositing and the exposing and occurring between plates of a dual plate capacitively coupled reactor for a time of from 20 to 100 seconds at a plate spacing of from 400 to 600 mils, a RF power range of from 300 to 1000 Watts, a pressure range of from 1 to 6 Torr, a temperature range of from 100 to 450° C., an oxygen-comprising gas flow rate of from 500 to 1500 sccm, and an inert gas flow rate of from 200 to 800 sccm, wherein a whole of the dielectric layer subjected to the exposing is not transformed from one base chemistry to another by the exposing.

* * * * *

UNITED STATES PATENT AND TRADEMARK OFFICE
CERTIFICATE OF CORRECTION

PATENT NO. : 7,521,354 B2  Page 1 of 1
APPLICATION NO. : 11/266914
DATED : April 21, 2009
INVENTOR(S) : Li et al.

It is certified that error appears in the above-identified patent and that said Letters Patent is hereby corrected as shown below:

In column 7, line 41, in Claim 2, delete "aver" and insert -- layer --, therefor.

In column 7, line 43, in Claim 2, delete "aver" and insert -- layer --, therefor.

In column 7, line 62, in Claim 4, delete "aver" and insert -- layer --, therefor.

In column 8, line 34, in Claim 11, delete "aver" and insert -- layer --, therefor.

Signed and Sealed this

Fourth Day of August, 2009

JOHN DOLL
*Acting Director of the United States Patent and Trademark Office*